(12) United States Patent
Lin et al.

(10) Patent No.: US 10,535,639 B2
(45) Date of Patent: Jan. 14, 2020

(54) SEMICONDUCTOR DEVICE AND MANUFACTURING METHOD OF THE SAME

(71) Applicant: TAIWAN SEMICONDUCTOR MANUFACTURING COMPANY LTD., Hsinchu (TW)

(72) Inventors: Jing-Cheng Lin, Hsinchu (TW); Ying-Ching Shih, Hsinchu (TW); Pu Wang, Hsinchu (TW); Chen-Hua Yu, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/410,753

(22) Filed: May 13, 2019

(65) Prior Publication Data
US 2019/0279966 A1 Sep. 12, 2019

Related U.S. Application Data

(63) Continuation of application No. 15/457,299, filed on Mar. 13, 2017, now Pat. No. 10,290,609.

(60) Provisional application No. 62/407,744, filed on Oct. 13, 2016.

(51) Int. Cl.
*H01L 25/065* (2006.01)
*H01L 23/00* (2006.01)
(Continued)

(52) U.S. Cl.
CPC ........ *H01L 25/0657* (2013.01); *H01L 21/561* (2013.01); *H01L 21/563* (2013.01);
(Continued)

(58) Field of Classification Search
CPC ............. H01L 21/76877; H01L 21/563; H01L 21/565; H01L 2924/00014;
(Continued)

(56) References Cited

U.S. PATENT DOCUMENTS

| | | | |
|---|---|---|---|
| 2013/0105991 A1* | 5/2013 | Gan | H01L 25/105 257/777 |
| 2015/0279805 A1* | 10/2015 | Karhade | H01L 25/50 257/737 |
| 2016/0233196 A1* | 8/2016 | Kim | H01L 25/0657 |

FOREIGN PATENT DOCUMENTS

KR 20130015680 A * 2/2013 ............ H01L 24/19

OTHER PUBLICATIONS

Machine Translation of KR20130015680A (Jeong Jin Wook) "Semiconductor Package and Method of Manufacturing the Same" (Feb. 14, 2013).*

* cited by examiner

*Primary Examiner* — Caridad Everhart
(74) *Attorney, Agent, or Firm* — WPAT, P.C., Intellectual Property Attorneys; Anthony King

(57) ABSTRACT

Some embodiments of the present disclosure provide a semiconductor device. The semiconductor device includes: a bottom package; wherein an area of a contact surface between the conductor and the through via substantially equals a cross-sectional area of the through via, and the bottom package includes: a molding compound; a through via penetrating through the molding compound; a die molded in the molding compound; and a conductor on the through via. An associated method of manufacturing the semiconductor device is also disclosed.

20 Claims, 15 Drawing Sheets

(51) Int. Cl.
   *H01L 25/00*  (2006.01)
   *H01L 25/10*  (2006.01)
   *H01L 21/56*  (2006.01)
   *H01L 21/683* (2006.01)
   *H01L 21/768* (2006.01)
   *H01L 23/31*  (2006.01)
   *H01L 23/48*  (2006.01)

(52) U.S. Cl.
   CPC ........ *H01L 21/565* (2013.01); *H01L 21/6835* (2013.01); *H01L 21/76802* (2013.01); *H01L 21/76877* (2013.01); *H01L 23/3121* (2013.01); *H01L 23/3135* (2013.01); *H01L 23/3142* (2013.01); *H01L 23/3157* (2013.01); *H01L 23/481* (2013.01); *H01L 24/19* (2013.01); *H01L 24/20* (2013.01); *H01L 24/97* (2013.01); *H01L 25/105* (2013.01); *H01L 25/50* (2013.01); *H01L 21/568* (2013.01); *H01L 23/3128* (2013.01); *H01L 24/17* (2013.01); *H01L 24/48* (2013.01); *H01L 24/49* (2013.01); *H01L 24/73* (2013.01); *H01L 24/83* (2013.01); *H01L 24/92* (2013.01); *H01L 2221/68359* (2013.01); *H01L 2224/16113* (2013.01); *H01L 2224/16227* (2013.01); *H01L 2224/2919* (2013.01); *H01L 2224/48091* (2013.01); *H01L 2224/48106* (2013.01); *H01L 2224/48229* (2013.01); *H01L 2224/73267* (2013.01); *H01L 2224/8385* (2013.01); *H01L 2224/92244* (2013.01); *H01L 2225/0651* (2013.01); *H01L 2225/0652* (2013.01); *H01L 2225/06517* (2013.01); *H01L 2225/06548* (2013.01); *H01L 2225/06568* (2013.01); *H01L 2225/06572* (2013.01); *H01L 2225/06586* (2013.01); *H01L 2225/1035* (2013.01); *H01L 2225/1058* (2013.01); *H01L 2924/00014* (2013.01); *H01L 2924/01013* (2013.01); *H01L 2924/01022* (2013.01); *H01L 2924/01028* (2013.01); *H01L 2924/01029* (2013.01); *H01L 2924/01074* (2013.01); *H01L 2924/13091* (2013.01); *H01L 2924/15311* (2013.01); *H01L 2924/181* (2013.01); *H01L 2924/18162* (2013.01)

(58) Field of Classification Search
   CPC ............. H01L 2924/181; H01L 21/486; H01L 23/481; H01L 24/19; H01L 25/105
   See application file for complete search history.

SEMICONDUCTOR DEVICE AND MANUFACTURING METHOD OF THE SAME

CROSS-REFERENCE TO RELATED APPLICATIONS

This application is a continuation of application Ser. No. 15/457,299, filed on Mar. 13, 2017, which claims the benefit of U.S. provisional Application No. 62/407,744, filed Oct. 13, 2016, which is incorporated by reference in its entirety.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging. How to reduce the production complexity and cost of packaging has become an urgent issue in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
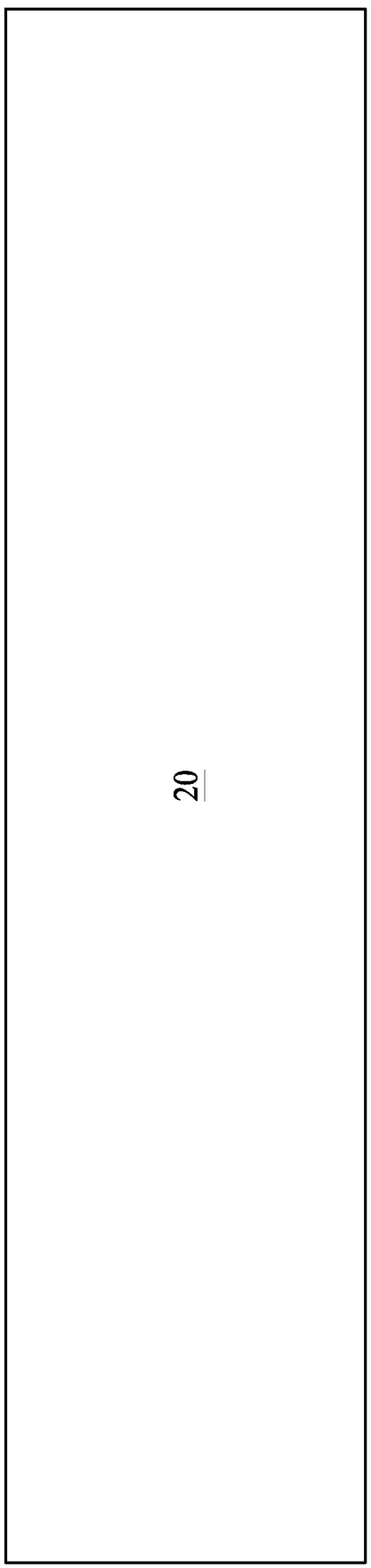
FIGS. 1 through 13 are cross-sectional views of intermediate stages in the manufacturing of a package structure in accordance with some exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Army numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An Integrated Fan-Out (InFO) package without a laser drill process is provided along with methods of forming the same in accordance with various exemplary embodiments. The intermediate stages of forming the InFO package are illustrated. The variations of the embodiments are discussed. Throughout the various views and illustrative embodiments, like reference numbers are used to designate like elements.

Figure 2:
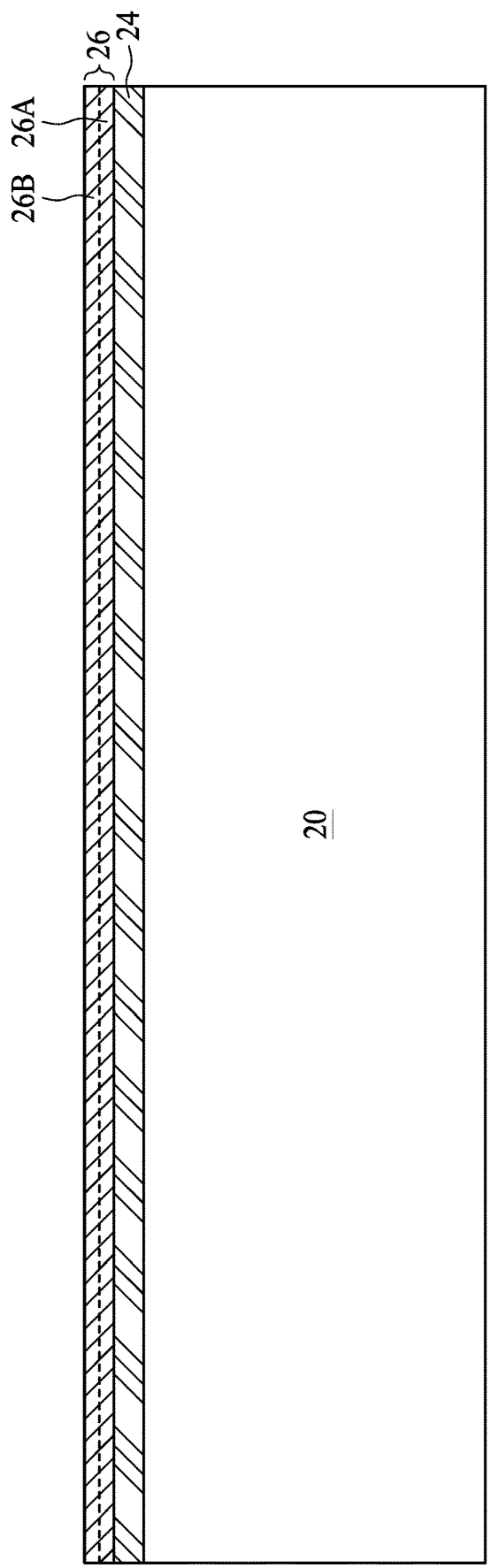

FIGS. 1 through 13 are cross-sectional views of intermediate stages in the manufacturing of a package structure in accordance with some exemplary embodiments. Referring to FIG. 1, a carrier 20 is provided. The carrier 20 may be configured to provide structural rigidity or a base for deposition of subsequent non-rigid layers. In one embodiment, the carrier 20 may be a glass carrier, a ceramic carrier, or the like. For example, in some embodiments, the carrier 20 may alternatively be a wafer, semiconductor, metal, synthetic or other material having a suitable topography and structural rigidity. Referring to FIG. 2, a sacrificial layer 24 is formed over the carrier 20 without forming a dielectric layer (e.g. a polymer layer) that is normally formed before a subsequent seed layer formation in existing manufacturing processes. The dielectric layer that omitted here may be, for example, polyimide, PolyBenzOxazole (PBO), BenzoCycloButene (BCB), Ajinomoto Buildup Film (ABF), Solder Resist film (SR), or the like. The concept of the embodiments is using the sacrificial layer 24 to replace the existing dielectric layer, and thereby achieving a purpose of saving the laser drill process required in existing manufacturing processes. Associated details will be described in the following paragraphs.

Also, as illustrated in FIG. 2, a seed layer 26 is formed on the sacrificial layer 24, for example, through Physical Vapor Deposition (PVD) or metal foil laminating. The seed layer 26 may include copper, copper alloy, aluminum, titanium, titanium alloy, or combinations thereof. In some embodiments, the seed layer 26 includes a titanium layer 26A and a copper layer 26B over the titanium layer 26A. However, this is not a limitation of the present disclosure. In alternative embodiments, the seed layer 26 is a copper layer.

Figure 3:
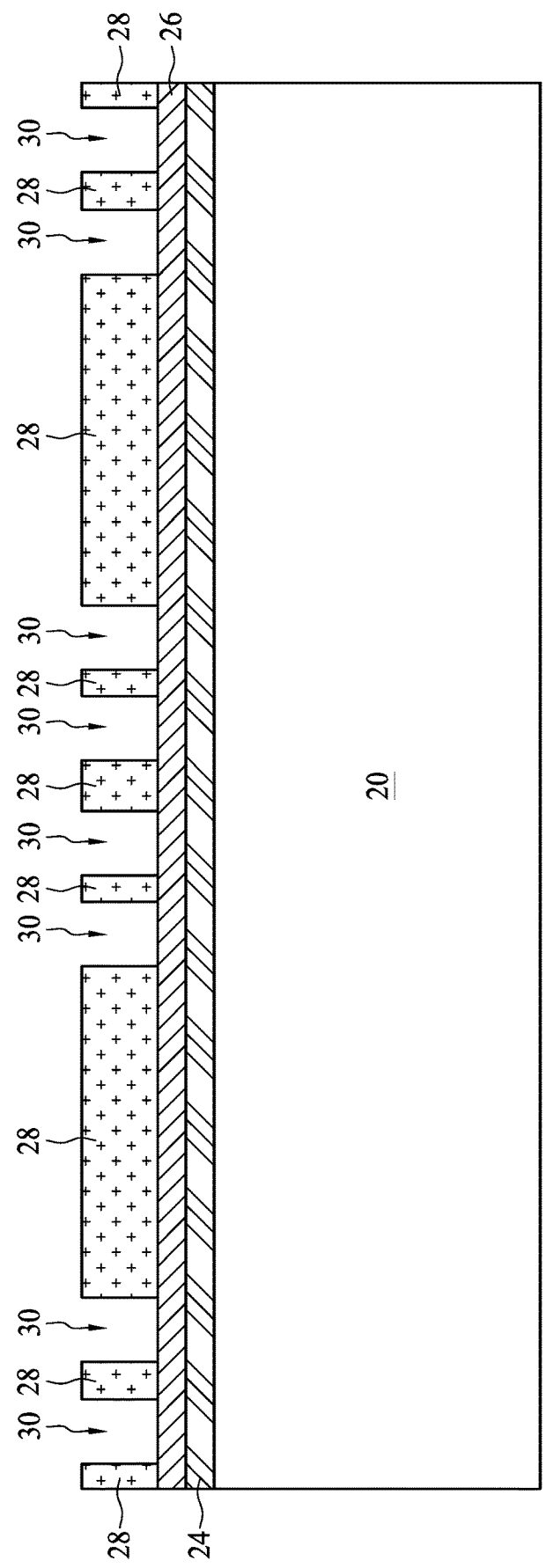

Referring to FIG. 3, a photo resist 28 is applied over the seed layer 26, and is patterned based on circuit design requirements. As a result, openings 30 are formed in the photo resist 28 to expose some portions of the seed layer 26.

Figure 4:
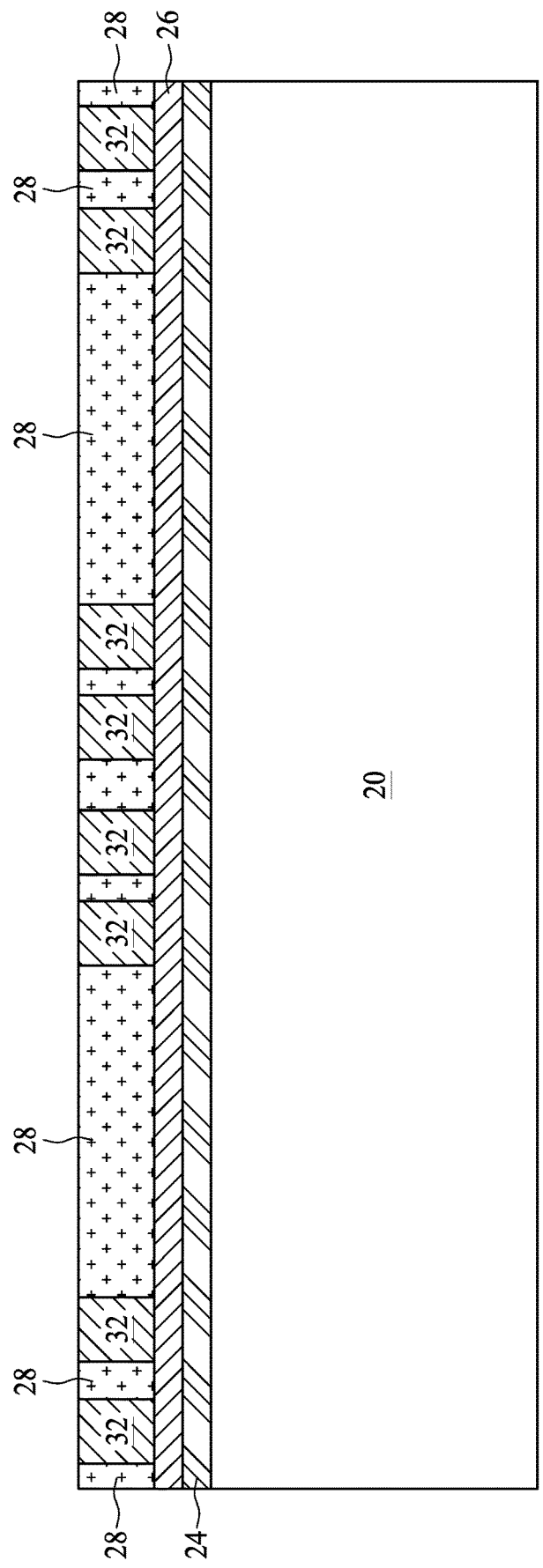
Figure 5:
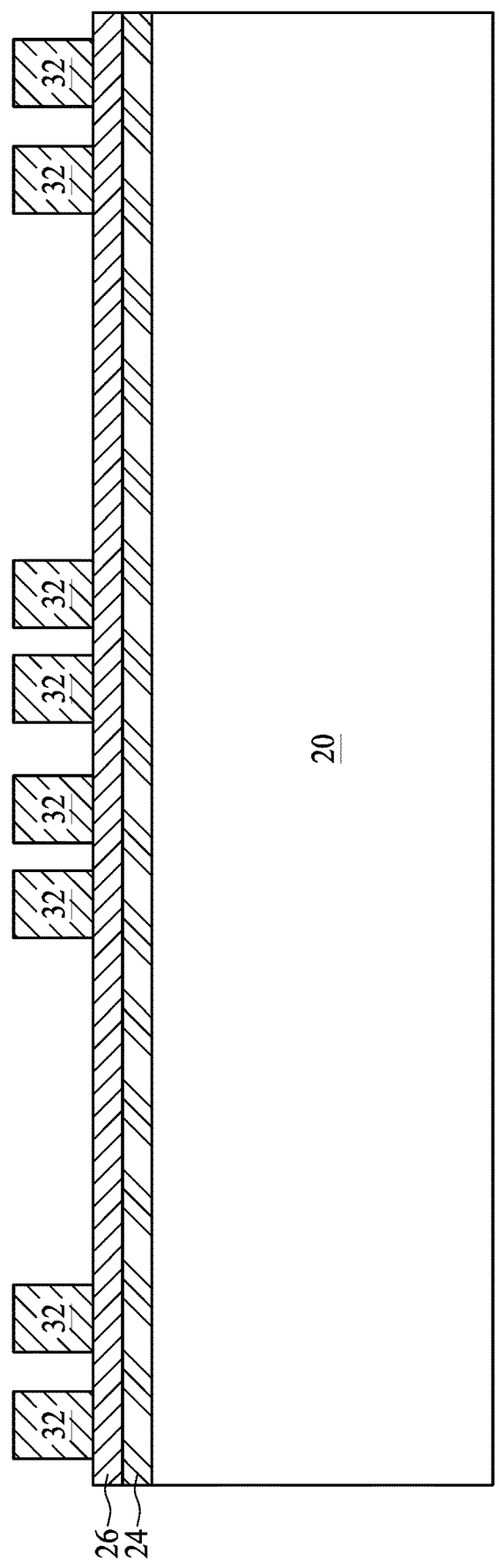

As shown in FIG. 4, metal features 32 are formed in openings 30 through plating, which may be electro plating or electro-less plating. The metal features 32 are plated on the exposed portions of seed layer 26 and may substantially fill the openings 30. The metal features 32 may include copper, aluminum, tungsten, nickel, solder, or alloys thereof. The top-view shapes of the metal features 32 may be rectangles, squares, circles, or the like. The heights of the metal features 32 may be designed according to a thickness of the subsequently placed dies 34 in FIG. 7, wherein the heights of the metal features 32 may be greater than the thickness of the dies 34 in some embodiments. After the plating of the metal features 32, the photo resist 28 is removed, and the resulting structure is shown in FIG. 5. After photo resist 28 is removed, the portions of the seed layer 26 that are covered by the photo resist 28 are exposed.

Figure 6:
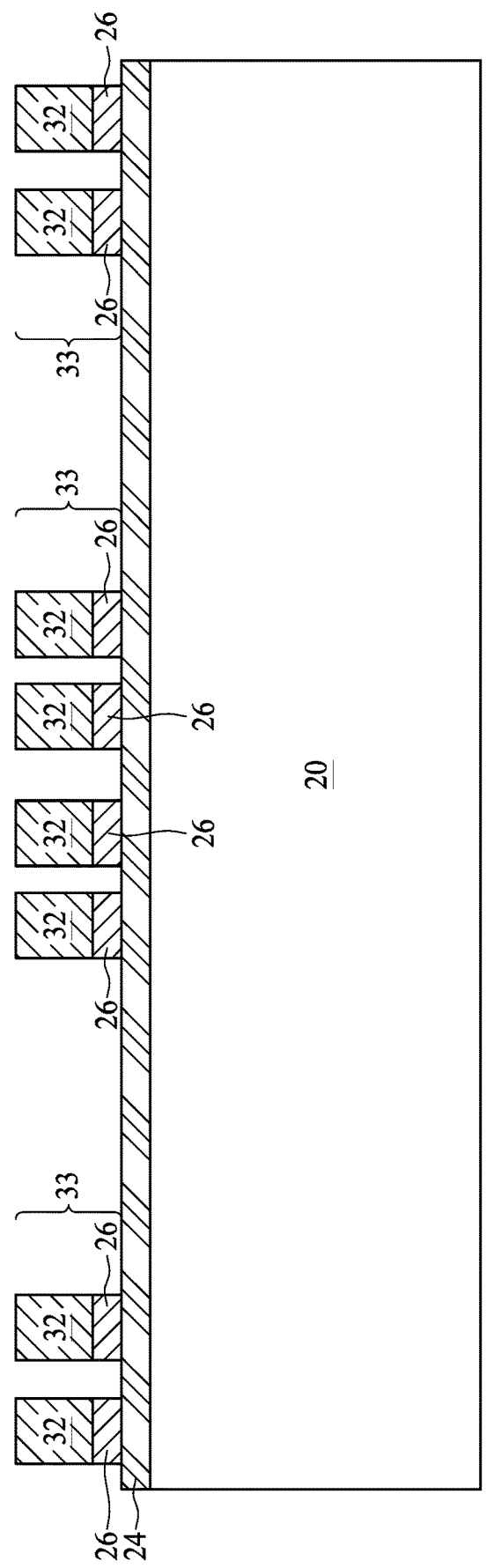

Referring to FIG. 6, an etch step is performed to remove the exposed portions of the seed layer 26, wherein the etching may be an anisotropic etching. The portions of the seed layer 26 that are overlapped by the metal features 32, on the other hand, remain not etched. Throughout the description, the metal features 32 and the remaining underlying portions of the seed layer 26 are in combination referred to as Through InFO Vias (TIVs) 33, which are also referred to as the through-vias 33. Although the seed layer 26 is shown as a layer separate from the metal features 32, when the seed layer 26 is formed of a material similar to or the same as the respective overlying the metal features 32, the seed layer 26 may be merged with the metal features 32 with no distinguishable interface therebetween. In alternative embodiments, distinguishable interfaces exist between the seed layer 26 and the overlying metal features 32.

Figure 7:
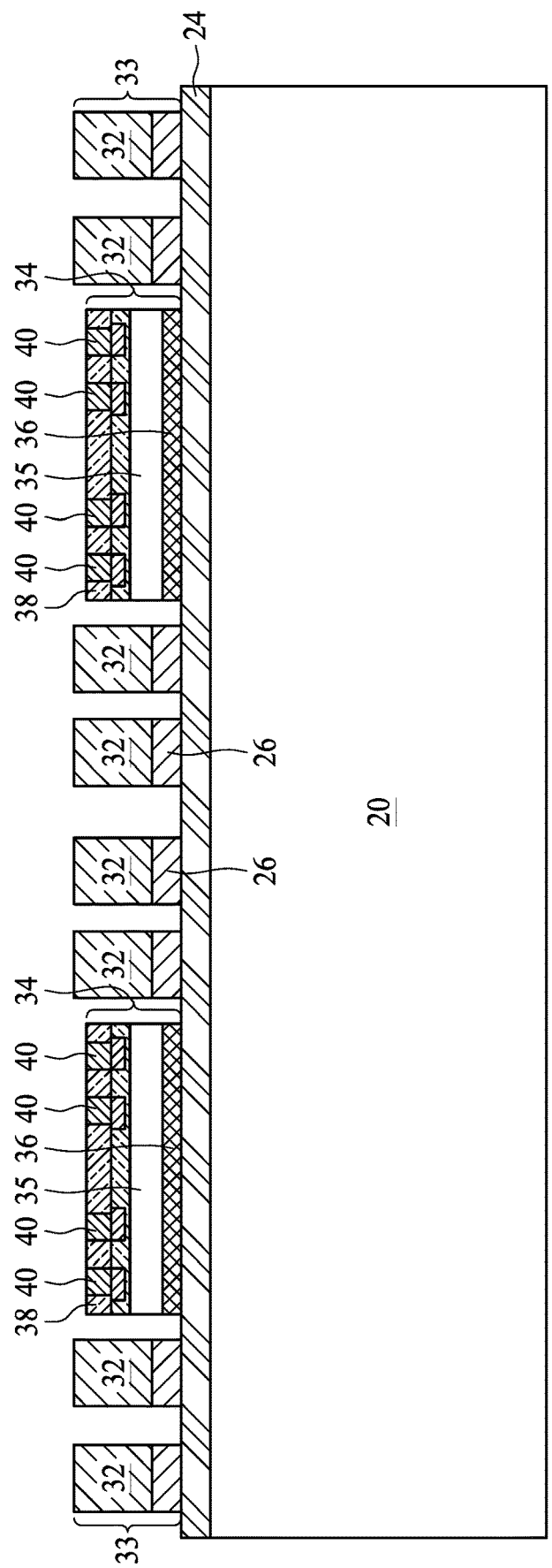

FIG. 7 illustrates the placement of device dies 34 over the sacrificial layer 24. The device dies 34 may be adhered to the sacrificial layer 24 through adhesive layer(s) 36. In one embodiment, the adhesive layer 36 may be adhesive tape or die attachment film (DAF), or alternatively, may be a glue or epoxy applied to the sacrificial layer 24 via a spin-on process, or the like. The application of the device dies 34 is not limited to application of a single die, as the presented disclosure may include more than one die. In some embodiments, the device dies 34 may have one or more mounts, which may for example, be contacts, pins, mounting pads, lands, or the like, for providing electrical connectivity to the circuit (not shown) within the device dies 34. The device dies 34 may include various passive and active microelectronic devices (not shown), such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, and/or any combinations thereof. The device dies 34 may be logic device dies including logic transistors therein. In some exemplary embodiments, the device dies 34 are designed for mobile applications, and may be Central Computing Unit (CPU) dies, Power Management Integrated Circuit (PMIC) dies, Transceiver (TRX) dies, or the like. Each of the device dies 34 includes a semiconductor substrate 35 (a silicon substrate, for example) that contacts the adhesive layer 36, wherein the back surface of the semiconductor substrate 35 is in contact with the adhesive layer 36.

The semiconductor substrate 35 as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements (not shown) that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

In some exemplary embodiments, metal pillars 40 (such as copper posts) are formed as the top portions of the device dies 34, and are electrically coupled to the devices such as transistors (not shown) in the device dies 34, in some embodiments, a dielectric layer 38 is formed at the top surface of the respective device die 34, with the metal pillars 40 having at least lower portions in the dielectric layer 38. The top surfaces of the metal pillars 40 may also be level with the top surfaces of the dielectric layers 38 in some embodiments. Alternatively, the dielectric layers 38 are not formed, and the metal pillars 40 protrude above a top dielectric layer of the respective device dies 34.

Figure 8:
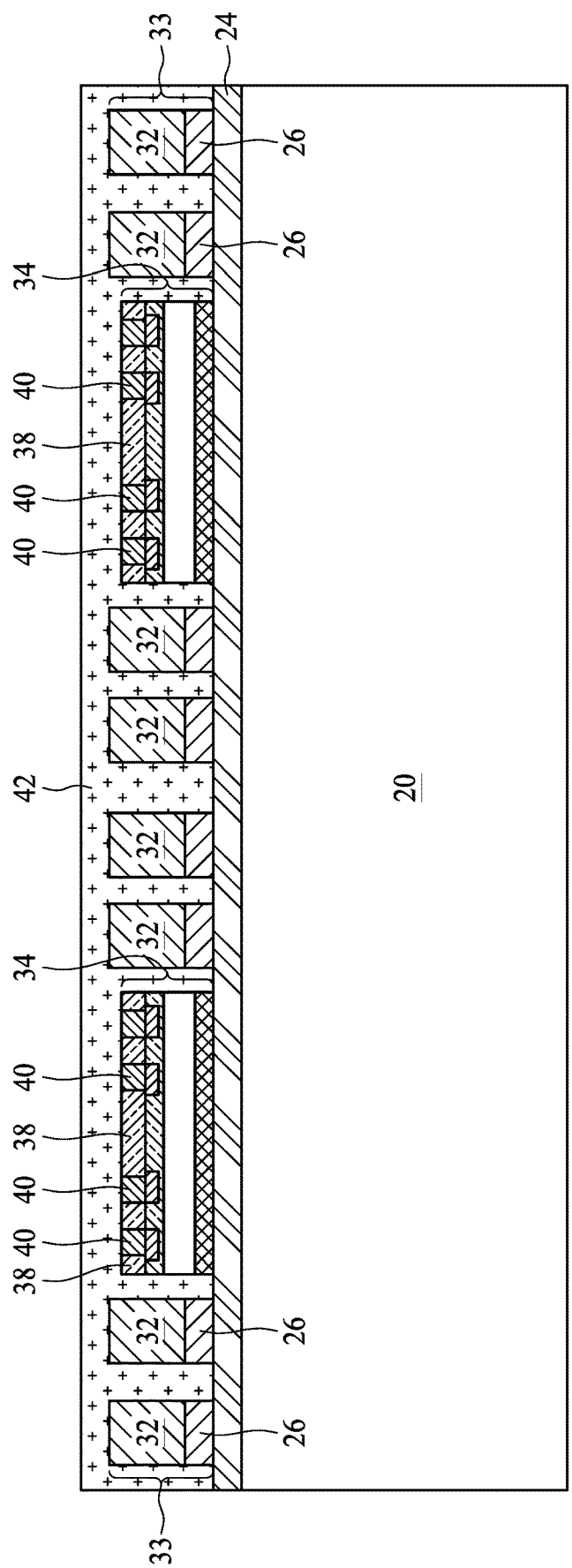

Referring to FIG. 8, a molding material 42 is molded on the device dies 34 and the TIVs 33. The molding material 42 fills the gaps between the device dies 34 and the TIVs 33, and may be in contact with the sacrificial layer 24, in some embodiments, the gaps between the metal pillars 40 of the device dies 34 may be filled by the molding material 42 as well. In some embodiments, the gaps between the metal pillars 40 of the device dies 34 may be filled beforehand. The molding material 42 may include an insulating material, such as an epoxy, a resin, a filler material, a stress release agent (SRA), an adhesion promoter, other materials, or combinations thereof, as examples. The molding material 42 may be applied while substantially liquid, and then may be cured through a chemical reaction, such as in an epoxy or resin. In another embodiment the molding material 42 may be an ultraviolet (UV) or thermally cured polymer applied as a gel or malleable solid capable of being disposed around the device dies 34 and the TIVs 33. In an embodiment employing a UV or thermally cured molding material 42, the molding material 42 may be formed in place using a mold, for example, bordering the perimeter of the molded area, such as a wafer or package.

The molding material 42 may then be partially removed. The molding material 42 may undergo, in some embodiments, a grinding step to remove excess material from the device dies 34 and TIVs 33. In such an embodiment, the molding material 42 may be subjected to a chemical-mechanical polish, a purely mechanical polish, chemical etching, or another suitable reduction process. The resulting reduced molding material 42 may, in some embodiments, have a top surface at or below the top surfaces of the TIVs 33 and the device dies 34. In the exemplary embodiment, the top surface of the TIVs 33 and the device dies 34 may be substantially planar with the top surface of the molding material 42. Thus, first ends of the TIVs 33 and the device dies 34 may be exposed at the polished side of the molding material 42 so that electrical contacts may be formed on the TIVs 33 and the device dies 34. In some embodiments, the grinding may also reduce the height of the TIVs 33 and the device dies 34.

Figure 9:
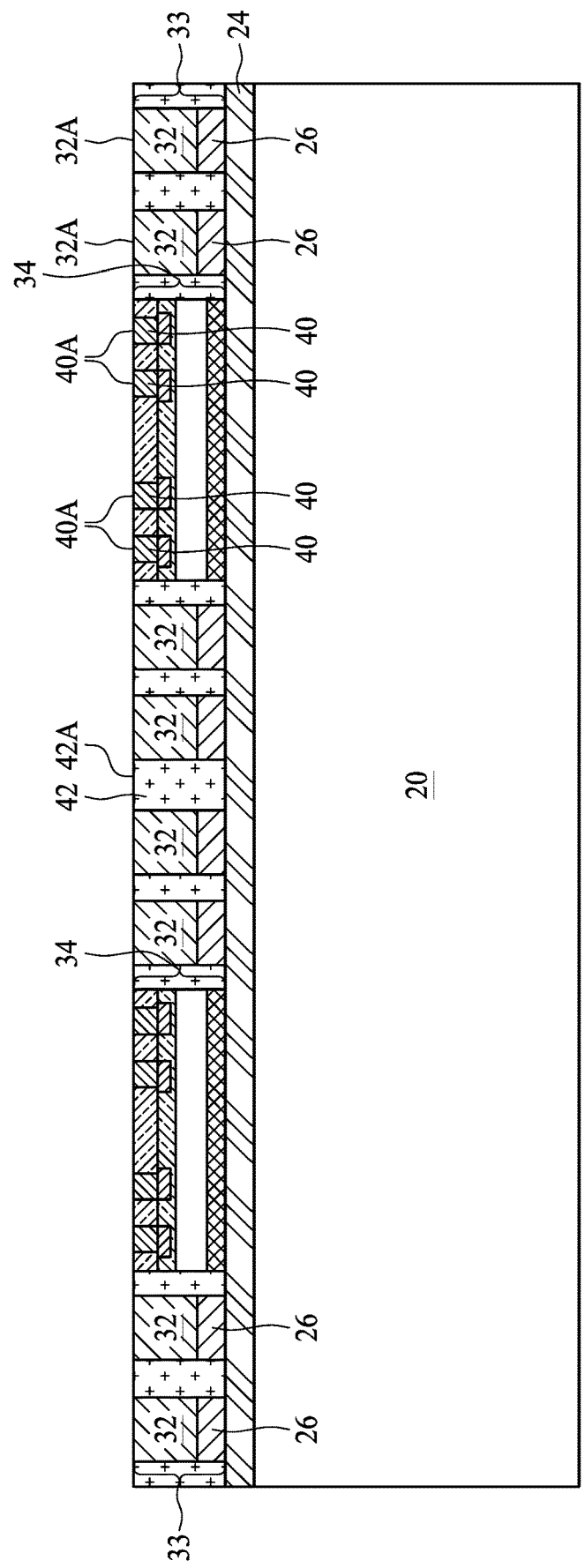

The resulting structure is shown in FIG. 9. Due to the grinding, the top ends 32A of the metal features 32 are substantially level (coplanar) with the top ends 40A of the metal pillars 40, and are substantially level (coplanar) with the top surface 42A of the molding material 42. As a result of the grinding, metal residues such as metal particles may be generated, and left on the top surfaces 32A, 40A, and 42A. Accordingly, after the grinding, a cleaning may be performed, for example, through a clean operation, so that the metal residue is removed.

Figure 10:
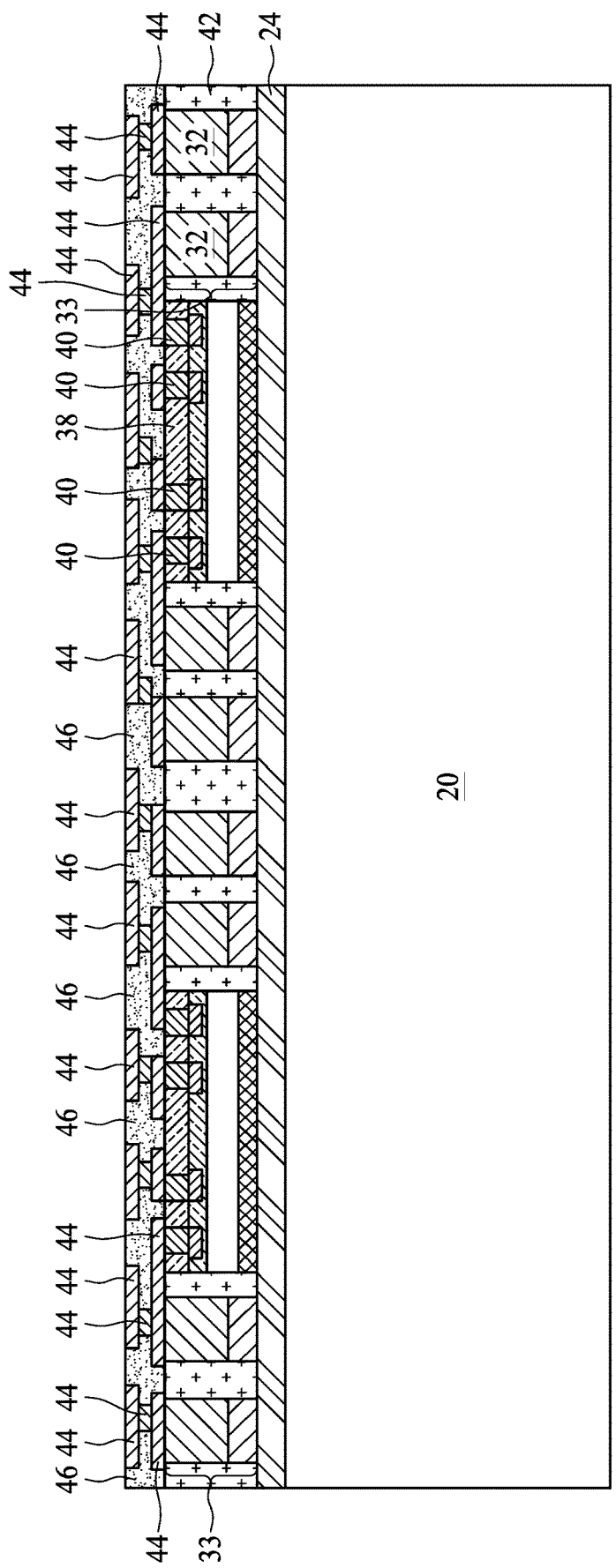

Next, referring to FIG. 10, Redistribution Lines (RDLs) 44 are formed over the molding material 42 to connect to the metal pillars 40 and the TIVs 33. The RDLs 44 may also interconnect the metal pillars 40 and the TIVs 33. In accordance with various embodiments, one or a plurality of the dielectric layers 46 are formed over the structure shown in FIG. 9, with the RDLs 44 formed in the dielectric layers 46. In some embodiments, the formation of one layer of the RDLs 44 and the dielectric layers 46 includes forming a blanket copper seed layer, forming and patterning a mask layer over the blanket copper seed layer, performing a plating to form the RDLs 44, removing the mask layer, and performing an etching to remove the portions of the blanket copper seed layer not covered by the RDLs 44. In alternative embodiments, the RDLs 44 are formed by depositing metal layers, patterning the metal layers, and fill the gaps between the RDLs 44 with the dielectric layers 46. The RDLs 44 may comprise a metal or a metal alloy including aluminum, copper, tungsten, and/or alloys thereof. FIG. 10 illustrates two layers of the RDLs 44, while there may be one or more than two layers of RDLs, depending on the routing requirement of the respective package. The dielectric layers 46 in these embodiments may comprise a polymer such as polyimide, benzocyclobutene (BCB), polybenzoxazole (PBO), or the like. Alternatively, the dielectric layers 46 may include non-organic dielectric materials such as silicon oxide, silicon nitride, silicon carbide, silicon oxynitride, or the like.

Figure 11:
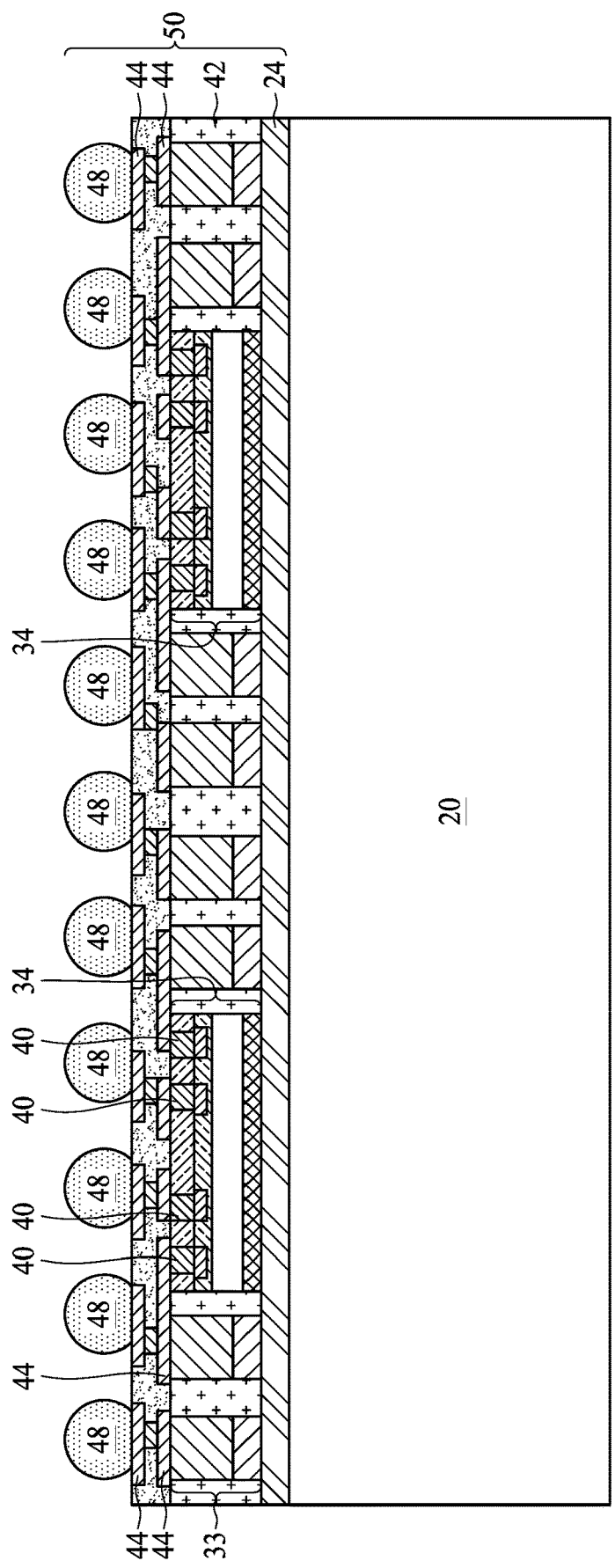

FIG. 11 illustrates the formation of electrical connectors 48 in accordance with some exemplary embodiments. The formation of the electrical connectors 48 may include placing solder balls on the exposed portions of the RDLs 44 (or Under-Bump Metallurgies (if formed, not shown)), and then reflowing the solder balls. In alternative embodiments, the formation of the electrical connectors 48 includes performing a plating step to form solder regions over the RDLs 44, and then reflowing the solder regions. The electrical connectors 48 may also include metal pillars, or metal pillars and solder caps, which may also be formed through plating. Throughout the description, the combined structure including the device dies 34, the TIVs 33, the molding material 42, the overlying RDLs 44 and the dielectric layers 46, and the sacrificial layer 24 is referred to as a TIV package 50, which may be a composite water.

Figure 12:
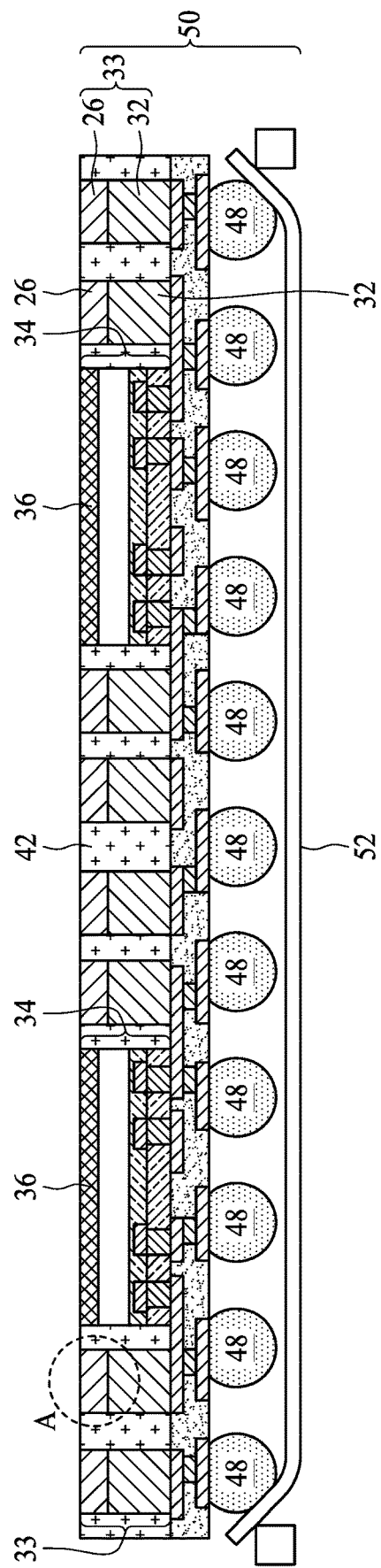

Next, the TIV package 50 along is detached from the carrier 20. The sacrificial layer 24 is removed along with the carrier 20 as well. The resulting structure is shown in FIG. 12. As mentioned in the above paragraph, the concept of the embodiments is using the sacrificial layer 24 to replace the existing dielectric layer. Since the sacrificial layer 24 is able to be removed when the carrier 20 is detached, the TIVs 33, the molding material 42, and the adhesive layer 36 are exposed and thereby achieving a purpose of saving the laser drill process performed upon the conventional dielectric layer in order to open the conventional dielectric layer and to expose the TIVs. Further, etching back of the conventional dielectric layer is also saved, and therefore the step height between the TIVs 33 and the molding material 42 can be less than about 1 micron according to some embodiments of the present disclosure. In other words, the TIVs 33 may be level with the top surface of the molding material 42 or protrude from the molding material 42 by about less than 1 micron.

Figure 13:
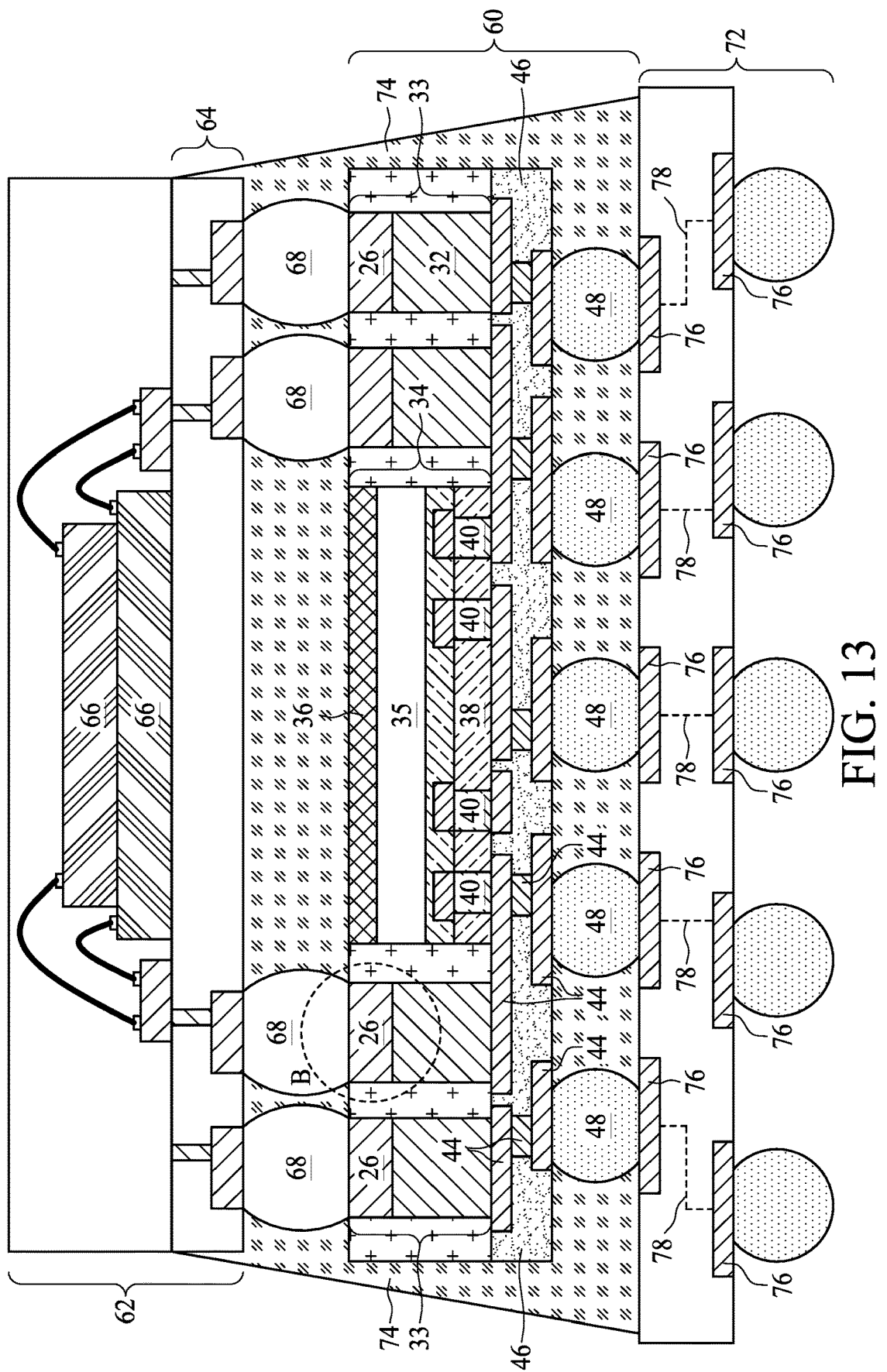

In some embodiments, the TIV package 50 may be sawed into a plurality of the TIV packages 60, and conductors are disposed on the end of the TIVs 33 to form solder regions 68 shown in FIG. 13. FIG. 13 illustrates the bonding of a top package 62 to TIV package 60, wherein the bonding may be through the solder regions (such as solder ball) 68. In some embodiments, the solder regions 68 may be solder balls of the top package 62 jointed to the TIV packages 60 through the TIVs 33. In the exemplary embodiments, the solder regions 68 fully contact with and cover the exposed top surface of the corresponding TIVs 33. Since the top surface of the corresponding TIVs 33 is exposed without being partially covered by the conventional dielectric layer, an area of a contact surface between each of the solder regions 68 and the corresponding TIVs 33 substantially equals a cross-sectional area of the TIVs 33.

Throughout the description, the TIV packages 60 are also referred to as bottom package 60 since they may act as the bottom packages. In some embodiments, the top package 62 includes device dies 66 bonded to a package substrate 64. The device dies 66 may include a memory die(s), which may be, for example, a Static Random Access Memory (SRAM) die, a Dynamic Random Access Memory (DRAM) die, or the like.

In some embodiments, the bonded top package 62 and TIV package 60 are further bonded to another package component 72, which may be a package substrate in some embodiments. However, this is not a limitation of the present disclosure. In some embodiments, underfill 74 is dispensed to in contact with the molding material 42 and at least surround the solder region 68. In some embodiments, the underfill 74 may include similar materials as described for the molding material 42. In some embodiments, the underfill 74 may include benzoic alcohol, epoxy resin, silica, and/or other materials, as examples.

The underfill material 42 may be applied using an underfill material dispensing tool or system in some embodiments. The underfill 74 can be applied using auger technology and a dispensing valve, as examples. In some embodiments, the underfill 74 is a liquid when applied so that it flows between and around the plurality of solder regions 68 between the bottom package 60 and the top package 62. The underfill 74 is then cured or allowed to dry so that it forms a solid.

In an alternative embodiment, package component 72 comprises a Printed Circuit Board (PCB). Package component 72 may have electrical connectors 76 (such as metal pads or metal pillars) on opposite sides, and metal traces 78 interconnecting the electrical connectors 76.

Figure 14:
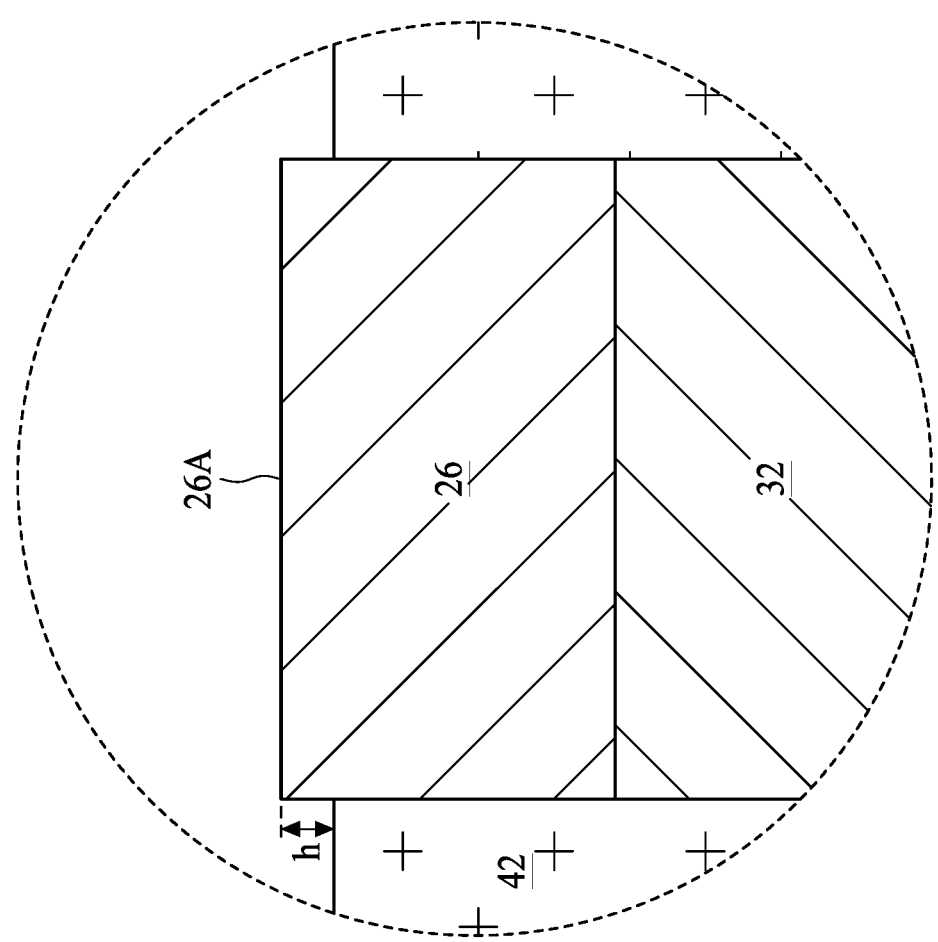
FIG. 14 is an enlarged diagram of area A of FIG. 12 according an embodiment of the present disclosure.

FIG. 14 is an enlarged diagram of area A of FIG. 12 according to an embodiment of the present disclosure. As mentioned in the above, the exemplary embodiments disclose a novel semiconductor device and an associated method by using the sacrificial layer 24 to replace the existing dielectric layer. Since the sacrificial layer 24 is able to be removed along with the carrier 20 when de-bonding the carrier 20, a top end 26A of the seed layer 26 of the TIVs 33 can be exposed naturally. In this way, conventional laser drill process performed upon the existing dielectric layer in order to open the existing dielectric layer and to expose the TIVs can be bypassed. Further, conventional etching back process for the existing dielectric layer can also be saved. Since the etching back process may more or less harm or damage the underneath molding material 42, a step height between the TIVs and the molding material in an existing structure may be magnified.

Normally, the conventional structure using the etching back process to remove the existing dielectric layer may have a step height which is between the TIVs and the molding material to be greater than 1 micron. However, in the present disclosure, a step height h between the TIVs 33 and the molding material 42 can be controlled to be less than about 1 micron according to some embodiments of the present disclosure as shown in FIG. 14. In other words, the step height h between the top end 26A of the seed layer 26 of the TIVs 33 and the adjacent molding material 42 can be less than about 1 micron according to some embodiments of the present disclosure as shown in FIG. 14. That is, the top end 26A of the seed layer 26 of the TIVs 33 may be substantially planar with the adjacent molding material 42; or the top end 26A of the seed layer 26 of the TIVs 33 may protrude from the adjacent molding material 42 by about less than 1 micron.

Figure 15:
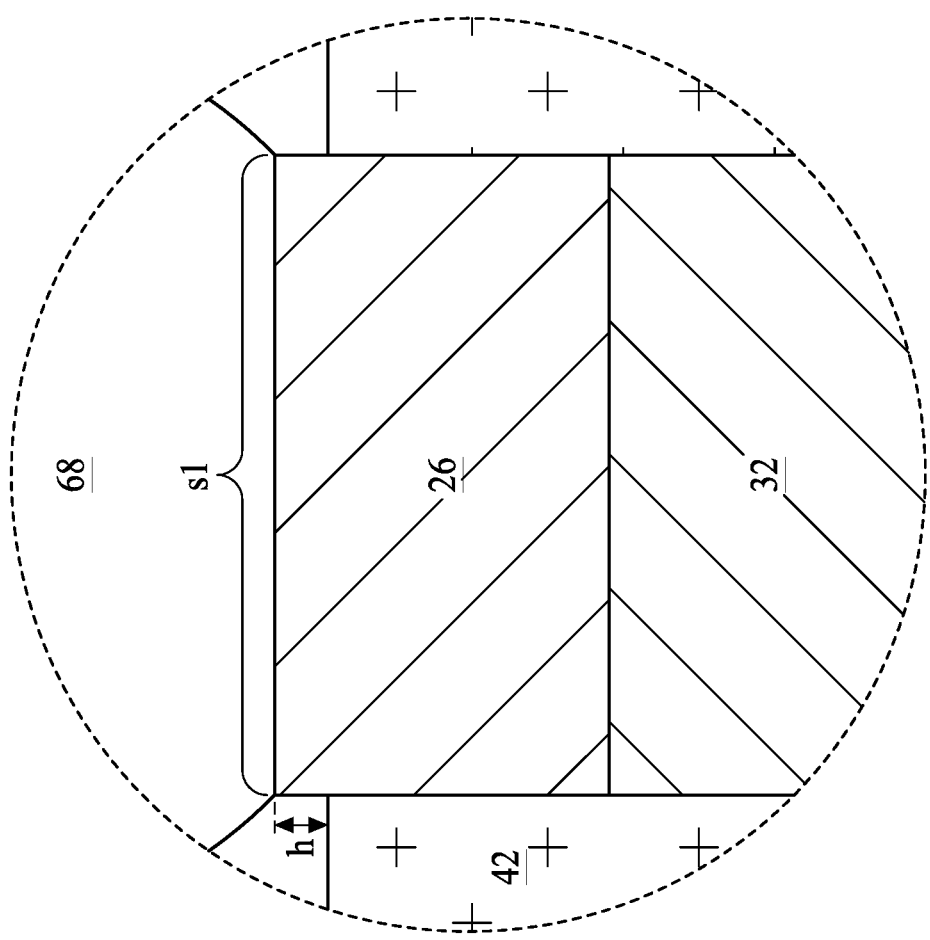
FIG. 15 is an enlarged diagram of area B of FIG. 13 according to an embodiment of the present disclosure.

FIG. 15 is an enlarged diagram of area B of FIG. 13 according to an embodiment of the present disclosure. As mentioned in the above, the exemplary embodiments disclose a novel semiconductor device and an associated method by using the sacrificial layer 24 to replace the existing dielectric layer. Since the sacrificial layer 24 is able to be removed along with the carrier 20 when de-bonding the carrier 20, a top end 26A of the seed layer 26 of the TIVs 33 can be exposed naturally. In this way, conventional laser drill (or other drilling operation) performed upon the existing dielectric layer in order to open the existing dielectric layer and to expose the TIVs becomes unnecessary. For the conventional structure, the existing dielectric layer may still more or less cover a portion of the top end of the TIVs, in particular the portion around the boundary of the out ring of the TIVs when seeing from a top view. Therefore, in those cases when the etching back process is not employed, the subsequent solder regions required to be formed on the TIVs may be partially separated from the top end of the TIVs by the dielectric layer around the boundary of the out ring of the TIVs. The incompletely joint between the TIVs and the solder regions may reduce the electric characteristic and the possibility of peeling.

In the exemplary embodiments, the top end of the seed layer 26 of the TIVs 33 is completely exposed. As a result, the solder regions 68 can fully contact with and fully cover the top end of the seed layer 26 of the TIVs 33. Since the top end of the TIVs 33 is exposed without being partially covered by the conventional dielectric layer, an area s1 of a contact surface between each of the solder regions 68 and the corresponding TIV 33 substantially equals an area of the top end of the seed layer 26 of the TIVs 33. In some embodiments, the area s1 of the contact surface between each of the solder regions 68 and the corresponding TIV 33 substantially equals a cross-section area of the TIVs 33.

Other features and processes may also be included. For example, testing structures may be included to aid in the verification testing of a 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Some embodiments of the present disclosure provide a semiconductor device. The semiconductor device includes: a bottom package; wherein an area of a contact surface between the conductor and the through via substantially equals a cross-sectional area of the through via, and the bottom package includes: a molding compound; a through via penetrating through the molding compound; a die molded in the molding compound; and a conductor on the through via.

Some embodiments of the present disclosure provide a semiconductor device. The semiconductor device includes: a bottom package, a top package over and bonded to the bottom package through the conductor; and an underfill between the top package and the bottom package; wherein the through via protrudes from the molding compound at a side where the conductor is located is less than about 1 micron, and the bottom package includes: a molding compound; a through via penetrating through the molding compound; a die molded in the molding compound; and a conductor on the through via.

Some embodiments of the present disclosure provide a method of manufacturing a semiconductor device. The method includes: providing a carrier; forming a sacrificial layer on the carrier; forming a through via over the sacrificial layer; disposing a die on the sacrificial layer; forming a molding compound on the sacrificial layer to fill gaps between the die and the through via; forming a redistribution layer over the die, the through via and the molding compound; removing the carrier and sacrificial layer to expose one end of the through via and the molding compound; disposing a conductor on the end of the through via; and disposing a underfill to surround the conductor, wherein the underfill is in physical contact with the molding compound.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
    a bottom package including:
        a molding compound;
        a through via penetrating through the molding compound;
        a die molded in the molding compound; and
        an adhesive layer over the die;
    a conductor on the through via;
    a top package over and bonded to the bottom package through the conductor; and
    an underfill between the top package and the bottom package;
    wherein an area of a contact surface between the conductor and the through via substantially equals a cross-sectional area of the through via, and the underfill is in physical contact with the molding compound.

2. The semiconductor device of claim 1, wherein the adhesive layer is in the molding compound, and a top surface of the adhesive layer is in physical contact with the underfill.

3. The semiconductor device of claim 1, wherein a step height between the through via and the molding compound at a side where the conductor is located is less than about 1 micron.

4. The semiconductor device of claim 1, wherein the through via includes a seed layer.

5. The semiconductor device of claim 4, wherein the through via further includes a metal feature.

6. The semiconductor device of claim 5, wherein a top surface of the seed layer is completely in physical contact with the conductor.

7. The semiconductor device of claim 6, wherein the seed layer protrudes from the adjacent molding compound by less than about 1 micron.

8. A semiconductor device, comprising:
    a bottom package including:
        a molding compound;
        a through via penetrating through the molding compound;
        a die molded in the molding compound; and
        an adhesive layer over the die;
    a conductor on the through via;
    a top package over and bonded to the bottom package through the conductor; and
    wherein the through via protrudes from the molding compound at a side where the conductor is formed.

9. The semiconductor device of claim 8, further comprising:
    an underfill between the top package and the bottom package;
    wherein the underfill is in physical contact with the molding compound.

10. The semiconductor device of claim 9, wherein an area of a contact surface between the conductor and the through via substantially equals a cross-sectional area of the through via.

11. The semiconductor device of claim 9, wherein the adhesive layer is in the molding compound, and a top surface of the adhesive layer is in physical contact with the underfill.

12. The semiconductor device of claim 8, wherein the through via includes a seed layer.

13. The semiconductor device of claim 12, wherein the through via further includes a metal feature.

14. The semiconductor device of claim 13, wherein a top surface of the seed layer is completely in physical contact with the conductor.

15. The semiconductor device of claim 14, wherein a step height between the top surface of the seed layer and the adjacent molding compound is less than about 1 micron.

16. A semiconductor device, comprising:
    a bottom package including:
        a molding compound;
        a through via penetrating through the molding compound, wherein the through via includes a seed layer;
        a die molded in the molding compound;
        an adhesive layer over the die; and
        a conductor on the through via, wherein an area of a contact surface between the conductor and the through via substantially equals a cross-sectional area of the through via.

17. The semiconductor device of claim 16, wherein the through via further includes a metal feature.

18. The semiconductor device of claim 16, wherein the adhesive layer is in the molding compound.

19. The semiconductor device of claim 16, wherein a step height between the through via and the molding compound at a side where the conductor is located is less than about 1 micron.

20. The semiconductor device of claim 16, wherein the through via includes a seed layer.

* * * * *